US012768866B2

(12) United States Patent
Landis et al.

(10) Patent No.: US 12,768,866 B2
(45) Date of Patent: Oct. 20, 2026

(54) BUS BAR CURRENT SENSOR MOUNTING BRACKET

(71) Applicant: Caterpillar, Inc., Peoria, IL (US)

(72) Inventors: C. Brahm Landis, Indianapolis, IN (US); Timothy R. Beetler, Peoria, IL (US); Brian R. Bell, West Lafayette, IN (US)

(73) Assignee: Caterpillar, Inc., Peoria, IL (US)

( * ) Notice: Subject to any disclaimer, the term of this patent is extended or adjusted under 35 U.S.C. 154(b) by 155 days.

(21) Appl. No.: 18/737,365

(22) Filed: Jun. 7, 2024

(65) Prior Publication Data

US 2025/0377387 A1 Dec. 11, 2025

(51) Int. Cl.
*G01R 19/00* (2006.01)
*G01R 33/07* (2006.01)

(52) U.S. Cl.
CPC ....... *G01R 19/0092* (2013.01); *G01R 33/072* (2013.01)

(58) Field of Classification Search
CPC ......................... G01R 19/0092; G01R 33/072; G01R 19/165; G01R 19/175; G01R 19/00
USPC ......................................... 324/156, 127, 133
See application file for complete search history.

(56) References Cited

U.S. PATENT DOCUMENTS

| | | | | |
|---|---|---|---|---|
| 6,628,102 | B2 * | 9/2003 | Batson | H01M 10/12 320/128 |
| 7,583,072 | B2 | 9/2009 | Muraki | |
| 9,425,601 | B2 | 8/2016 | Vinnedge | |
| 10,317,435 | B2 | 6/2019 | Okuzuka | |
| 11,287,450 | B2 | 3/2022 | Tamura | |
| 2007/0200551 | A1 * | 8/2007 | Muraki | G01R 15/207 324/127 |
| 2008/0050985 | A1 | 2/2008 | Roset et al. | |
| 2011/0050222 | A1 * | 3/2011 | Ueno | G01R 15/207 324/253 |
| 2011/0068771 | A1 * | 3/2011 | Ueno | G01R 15/202 324/117 R |
| 2023/0253892 | A1 | 8/2023 | Takabayashi | |

FOREIGN PATENT DOCUMENTS

| | | | |
|---|---|---|---|
| CN | 217655168 U | 10/2022 | |
| JP | 5156683 B2 | 7/2009 | |
| JP | 2013113687 A * | 6/2013 | G01R 15/20 |

OTHER PUBLICATIONS

Written Opinion and International Search Report for Int'l. Patent Appln. No. PCT/US2025/031087, mailed Sep. 17, 2025 (25 pgs).

* cited by examiner

*Primary Examiner* — Lee E Rodak
*Assistant Examiner* — Taqi R Nasir

(57) ABSTRACT

A bracket assembly for supporting a pass-through current sensor with respect to a bus bar is disclosed. The bracket assembly has two sections which each contain channels that conform to the shape of one or more segment of the bus bar. The sections are configured to couple to one another over the segments such that the bracket assembly is clamped to the bus bar. An aperture in the current sensor is passed over the bus bar and the sensor is coupled to the bracket assembly, thereby indirectly coupling the bus bar to the sensor.

12 Claims, 6 Drawing Sheets

BUS BAR CURRENT SENSOR MOUNTING BRACKET

TECHNICAL FIELD

The present disclosure relates generally to a sensor mounting bracket, and more particularly to a sensor mounting bracket for a bus bar.

BACKGROUND

Due to the compact nature and low resistance of bus bars, they are commonly used in areas that have space constraints and/or require high efficiency, such as energy transmission and distribution systems. To monitor performance in such systems, a variety of current sensors are used to measure the current passing through the bus bars, one such sensor type being a pass-through style sensor, an example of which is a hall effect sensor. Although having many advantages such as long lifespan and reliability even in harsh environments, pass-through sensors may have accuracy issues if the sensed load and sensor are moving out of sync due to shock or vibration of the system.

Systems have been developed to mount a pass-through sensor to a load-carrying line such that the sensor and line are fixed together. However, these systems require permanent modifications be done to the line such as drilling holes or using a mechanical bond, and/or the support fixing the sensor to a separate structure which provides rigidity to the system. This makes replacing old or broken components difficult, and also limits the areas such systems may be installed.

JP2009162785A discloses one such system. It includes a wall-mounting structure for a current sensor. The structure includes a bracket which mounts on one end directly to the current sensor and on another end directly to a separate rigid element. The bracket has a C shape and is slid over a side of the sensor such that the side of the sensor is contained within the C shape. The bracket has clamping members on opposing sides of the U shape which are used to grasp locking projections extending from sides of the sensor, thereby clamping or coupling the sensor within the bracket. The bracket, after being coupled to the sensor, is then attached to the rigid element to hold the sensor in a desired position such that the sensor does not move, and afterwards, a harness may be passed through the current sensor.

However, the wall-mounting structure in the '785 patent requires that the C-shaped bracket is clamped to multiple sides of the sensor, rather than a bracket which couples to a single side of the sensor. Additionally, the support in the '785 patent requires a separate rigid element to hold everything in the desired position, rather than solely relying on the line to support the bracket and sensor. Further, the support in the '785 patent couples to the inside of the sensor, and couples the line rigidly within the sensor, rather than floating the line within the sensor.

SUMMARY

In an aspect of the present disclosure, a bracket assembly is provided for supporting a pass-through current sensor with respect to a bus bar, the bus bar having a first segment. The bracket assembly includes a first bracket member, a second bracket member, and a fastener. The fastener is configured to secure the first bracket member to the second bracket member such that the first bracket member is in a contacting relationship with the first segment of the bus bar and the second bracket member is in a contacting relationship with the first segment of the bus bar. In this configuration, the bus bar extends through the current sensor.

In another aspect of the present disclosure, there is a bus bar assembly. The bus bar assembly includes a bus bar having a first side and a second side opposite the first side. The bus bar further includes a first segment. The bus bar assembly also includes a bracket assembly, which includes a first bracket member which has a first channel that conforms to a portion of the first segment of the bus bar. The first channel includes a top side which engages the first side. The bracket assembly also includes a second bracket member which has a second channel that defines a first channel section. The first channel section conforms to the portion of the first segment of the bus bar and includes a bottom side which engages the second side of the first segment. The bus bar assembly further includes a pass-through current sensor which includes an aperture which has a portion of the bus bar extending therethrough. Finally, the bus bar assembly includes a fastener which secures the first bracket member to the second bracket member over the first segment of the bus bar such that the first segment sits within the first channel and the first channel section. The fastener also secures the sensor to the second bracket member.

In yet another aspect of the present disclosure, a method is provided for mounting a current sensor to a bus bar. The bus bar includes a first side and a second side and further includes a first segment, a second segment, and a curved segment. The method includes the use of a bracket assembly which has a first bracket member that includes a first channel that conforms to the shape of the first segment of the bus bar. The bracket assembly further includes a second bracket member that includes a second channel that conforms to the shape of the first segment, second segment, and curved segment of the bus bar. The first bracket member is placed over the first side of the first segment of the bus bar such that the first segment sits within the first channel. Then, the second bracket member is placed over the second side of the first segment, the second segment, and the curved segment of the bus bar such that the first, second, and curved segments sit within the second channel. In doing so, the bus bar is pressed between the first bracket member and second bracket member. The second segment of the bus bar is passed through an aperture in the sensor, and then the current sensor is placed against the second bracket member. The current sensor, second bracket member, and first bracket member are then fastened together.

Other features and aspects of this disclosure will be apparent from the following description and the accompanying drawings.

DETAILED DESCRIPTION

Figure 1:
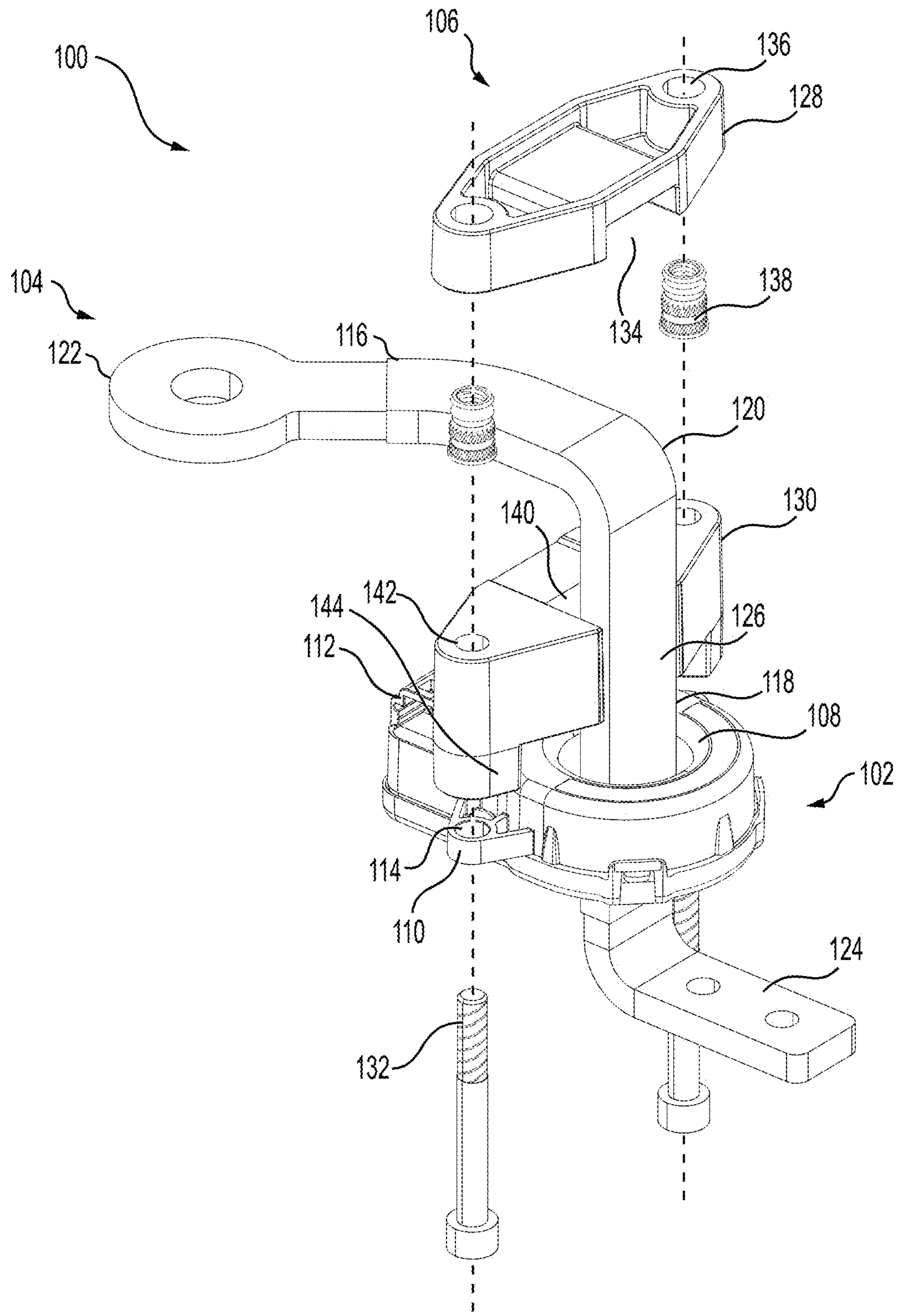
FIG. 1 is an exploded view of a bus bar assembly having a bent bus bar.

Referring to FIG. 1, there is shown an exploded view of a bus bar assembly 100. The bus bar assembly 100 includes a sensor 102, a bus bar 104, and a bracket assembly 106. When assembled, the bus bar assembly 100 is configured to hold the sensor 102 in position with the bus bar 104 using the bracket assembly 106, such that sensor 102 does not contact the bus bar 104.

The sensor 102 shown is a pass-through current sensor configured to measure a current running through the bus bar 104. The sensor 102 includes a main aperture 108, a plurality of ears 110, and a connector 112. The main aperture 108 is configured such that the bus bar 104 may pass therethrough without contacting the sensor 102. The ears 110 extend from the sensor 102 and each include a mounting aperture 114. The connector 112 allows the sensor to transmit to and/or receive information from another device.

The bus bar 104 shown is a solid metallic bar configured to carry an electrical load between two points. The bus bar 104 includes a first segment 116, a second segment 118, a curved segment 120, a first end 122, a second end 124, and a jacket 126. As shown, the segments, 116, 118, and 120, make up most of the bus bar 104, with the curved segment 120 between and connecting the first segment 116 and second segment 118.

The first end 122 is shown coupled to the first segment 116 opposite the curved segment 120, and similarly, the second end 124 is coupled to the second segment 118 opposite the curved segment 120. The ends, 122 and 124, are configured to couple to other electrical components, such that the segments, 116, 118, and 120, have no need for connectors themselves. The jacket 126 is shown as an epoxy coating which assists with electrically insulating the segments, 116, 118, and 120, as well as helps the bus bar 104 resist damage from external sources.

The illustrated bus bar 104, due to the solid metallic construction, is a rigid structure. As such, when the ends, 122 and 124, are rigidly coupled to other components, the bus bar 104 provides the mounting structure for the bus bar assembly 100. Accordingly, the other portions of the bus bar assembly 100, such as the sensor 102 and bracket assembly 106, need only be coupled to the bus bar 104 and do not need to be further mounted to other structure.

The bracket assembly 106 shown is a rigid structure configured to rigidly mount the sensor 102 to the bus bar 104. The bracket assembly 106 includes a first bracket member 128, a second bracket member 130, and a plurality of fasteners 132. The first bracket member 128 includes a first channel 134, a plurality of first apertures 136, and a plurality of mounts 138. The second bracket member 130 includes a second channel 140, a plurality of second apertures 142, and first and second legs 144.

Figure 2:
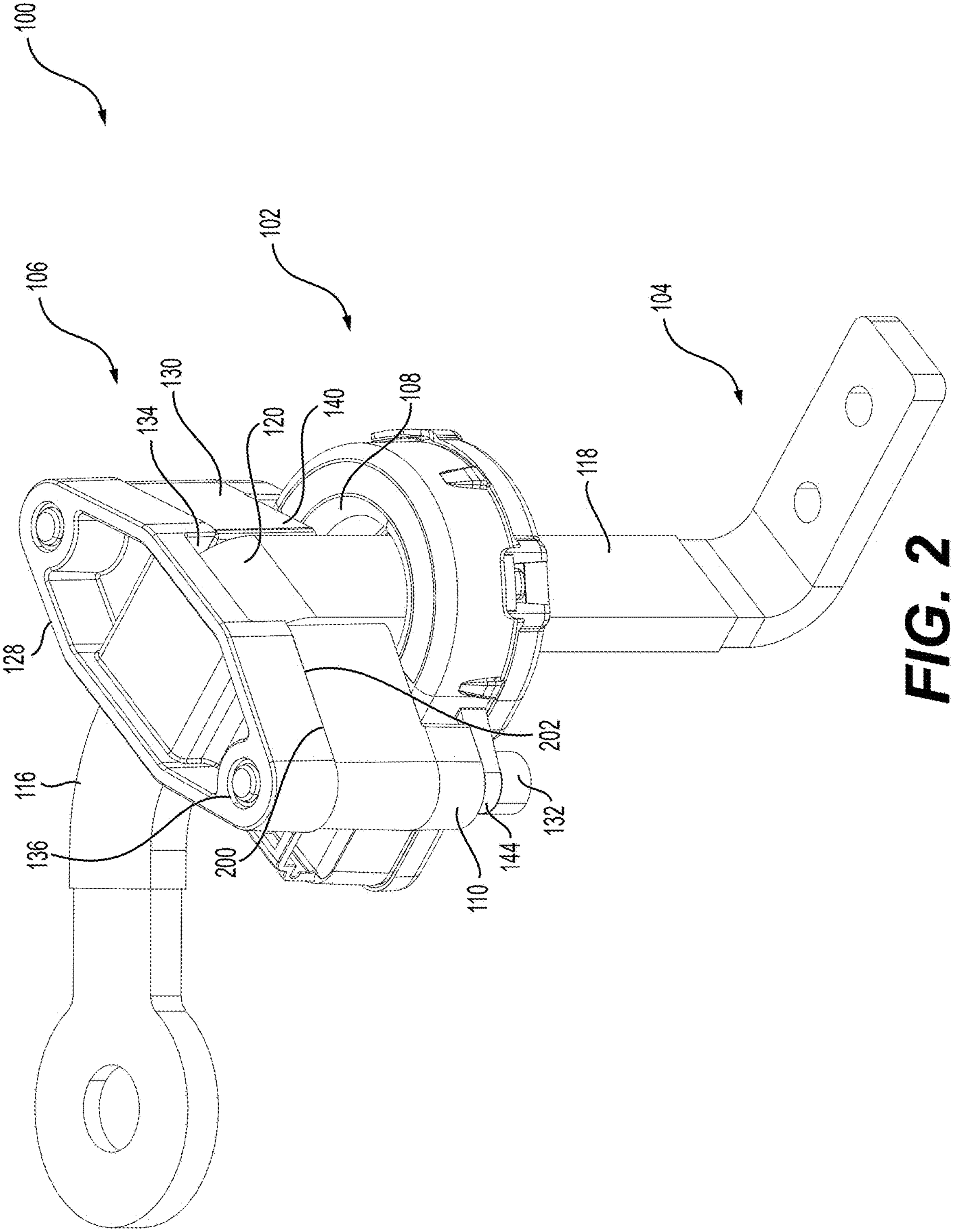
FIG. 2 is the bus bar assembly of FIG. 1 in a fully assembled configuration.

Referring to FIG. 2, there is shown a bus bar assembly 100 in a fully assembled configuration. When the bus bar assembly 100 is fully assembled, the bracket assembly 106 couples the sensor 102 to the bus bar 104 such that the sensor 102 and bus bar 104 are unable to move relative to one another. Although the illustrated sensor 102 and bus bar 104 do not contact one another, they are held together such that the second segment 118 of the bus bar 104 remains centrally within the main aperture 108, allowing the sensor 102 to obtain reliable and accurate readings when in use.

As shown, the bus bar 104 is coupled to the bracket assembly 106 by first placing a portion of the first segment 116 into the first channel 134. A top side 200 of the second bracket member 130 is then pressed against a bottom side 202 of the first bracket member 128, such that a remaining portion of the first segment 116 is placed within the second channel 140. In doing so, the first apertures 136 line up with the second apertures 142, and the second channel 140 covers the remaining portion of the first segment 116 as well as a portion of the second segment 118 and curved segment 120.

The location of the channels, 134 and 140, the combination pressing against the horizontal first segment 116 and the second channel 140 additionally pressing against the curved section 120 and vertical second segment 118, secures the bracket assembly 106 and bus bar 104 together in multiple axes. When properly fastened, the bracket assembly 106 and bus bar 104 are effectively fixed together and may not move separately from one another in any direction.

Afterwards, the main aperture 108 of the sensor 102 is passed over the bus bar 104, such that the main aperture 108 surrounds a portion of the second segment 118. The ears 110 of the sensor 102 are then pressed against the legs 144 of the second bracket member 130 such that the mounting apertures 114 line up with the second apertures 142. The second segment 118 of the bus bar 104 is centered within the main aperture 108 of the sensor 102, and there should be no direct contact between the sensor 102 and the bus bar 104.

Once the apertures, 114, 136, and 142, are aligned, the fasteners 132 are passed through the mounting aperture 114 and the second aperture 142 and are coupled to the first aperture 136. In this configuration, the first segment 116 of the bus bar 104 is compressed between the first channel 134 of the first bracket member 128 and the second channel 140 of the second bracket member 130 such that it is unable to move relative to the bracket assembly 106. Further, the sensor 102 is compressed between the fasteners 132 and the bracket assembly 106, such that the sensor 102 is also unable to move relative to the bracket assembly 106.

Accordingly, the sensor 102 and the bus bar 104 are rigidly and indirectly coupled to one another through the bracket assembly 106. As with the bracket assembly 106 and the bus bar 104, the sensor 102 and the bracket assembly 106, and therethrough the bus bar 104, are all effectively fixed together and are unable to move relative to one another.

In other embodiments, there may be additional fasteners 132 and/or mounting locations such that the first bracket member 128 and second bracket member 130 may be coupled to the bus bar 104 without requiring that the sensor 102 be coupled simultaneously. In such an embodiment, the bracket assembly 106 may be installed on the bus bar 104 prior to installing the sensor 102, or the sensor 102 may be installed on the second bracket member 130 prior to installing the bracket assembly 106 on the bus bar 104. Although the illustrated fasteners 132 are shown as bolts, further embodiments may include or change the fasteners 132 to clips, clamps, straps, screws, pins, magnets, and the like and combinations thereof.

Figure 3:
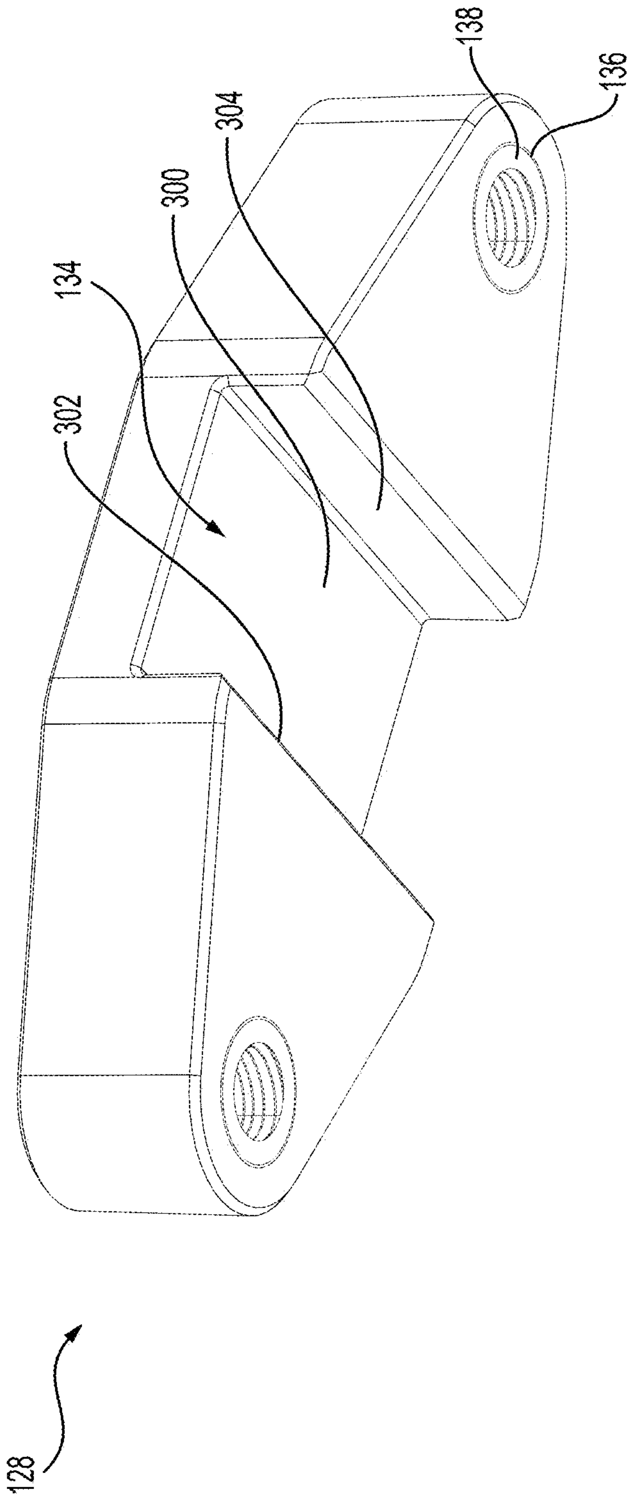
FIG. 3 is a bottom perspective view of a first bracket member.

Referring to FIG. 3, there is a bottom perspective view of a first bracket member 128. As shown, the first bracket member 128 includes a first channel 134, a plurality of first apertures 136, and a plurality of mounts 138. The first channel 134 includes a top side 300, a left side 302, and a right side 304, which are sized and positioned such that the width and thickness of the first channel 134 matches or otherwise conforms to the shape of the first segment 116 of the bus bar 104. Accordingly, the first segment 116 should be able to be placed within and removed from the first channel 134 with minimal movement between the pieces, and without causing damage to either the first channel 134 or the bus bar 104.

Figure 5:
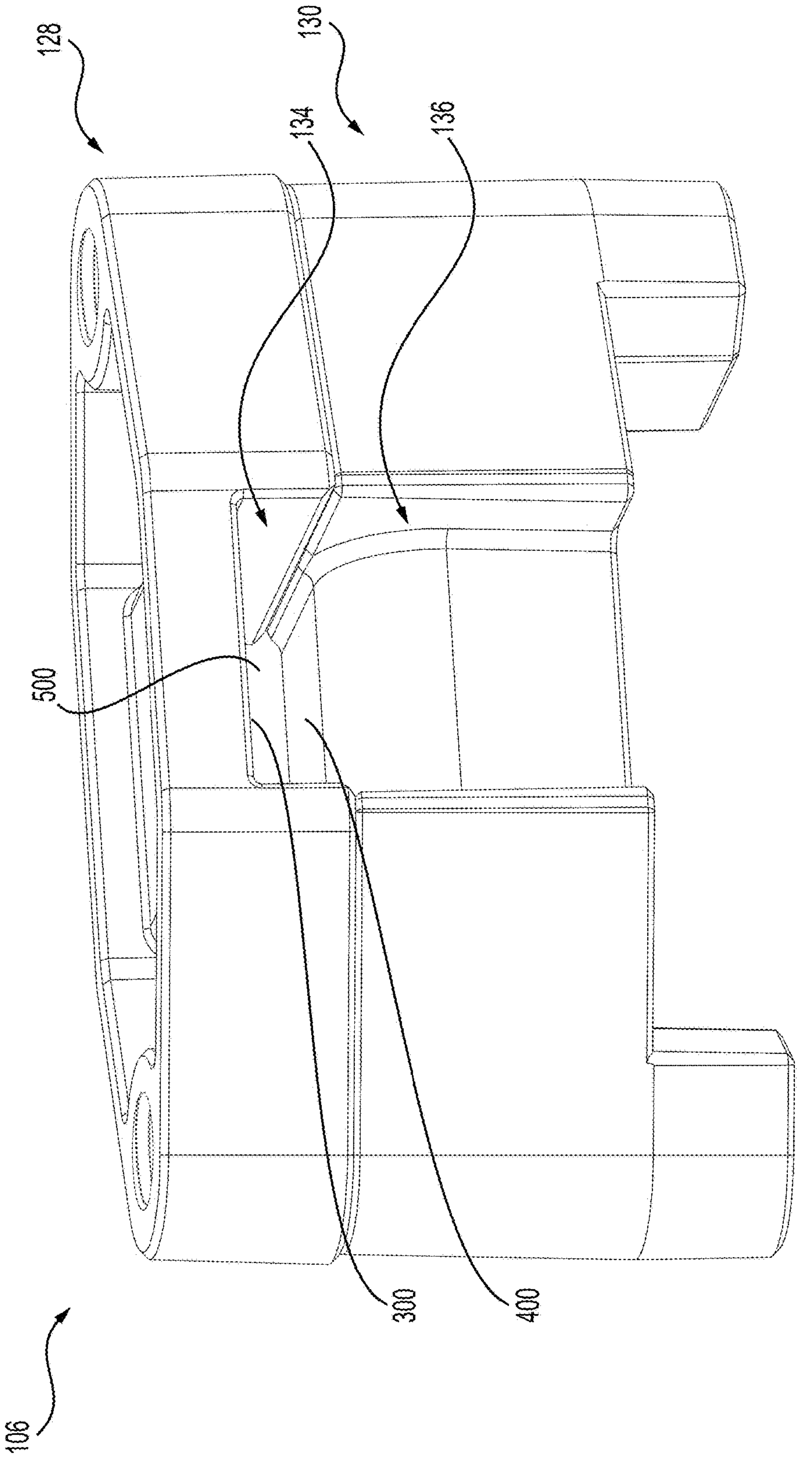
FIG. 5 is a bracket assembly in an assembled configuration.

As shown, the first segment 116 is rectangular in shape, leading to a rectangular channel 134 such that the top side 300 is wider than the equally sized left side 302 and right side 304. However, as shown in FIGS. 2 and 5, the left and right sides, 302 and 304, are not as tall as the first segment 116, such that the first segment 116, when placed within the first channel 134, extends out past the first channel 134 and partially nests within the second channel 140.

However, in other embodiments, the first segment 116 may be any number of shapes and may completely contain the first segment 116 of the bus bar 104 or may contain an even smaller portion of the first segment 116. For example, the first channel 134 may be shaped such that it also conforms to the curved segment 120 of the bus bar 104 to provide additional contact with the bus bar 104, which may provide better for better coupling between the pieces.

In further embodiments, the mounts 138 may be formed within the first apertures 136 such that they are a uniform piece and manufactured together, or the mounts 138 may be separate from the first bracket member 128, such that the fasteners 132 pass through the first apertures 136 and couple to the mounts 138 on the far side thereof, effectively sandwiching the first support member between the plurality of mounts 138 and fasteners 132.

In further embodiments, the sides, 300, 302, and 304, of the first channel 134 may include a texture or insert to provide additional grip when coupled to the bus bar 104, to help protect the first bracket member 128 and the bus bar 104, and/or to provide shock absorption between the first bracket member 128 and the bus bar 104. The texture or insert may be any number of materials and may be integral with the first channel 134 or may be removably coupled with the first channel 134.

Figure 4:
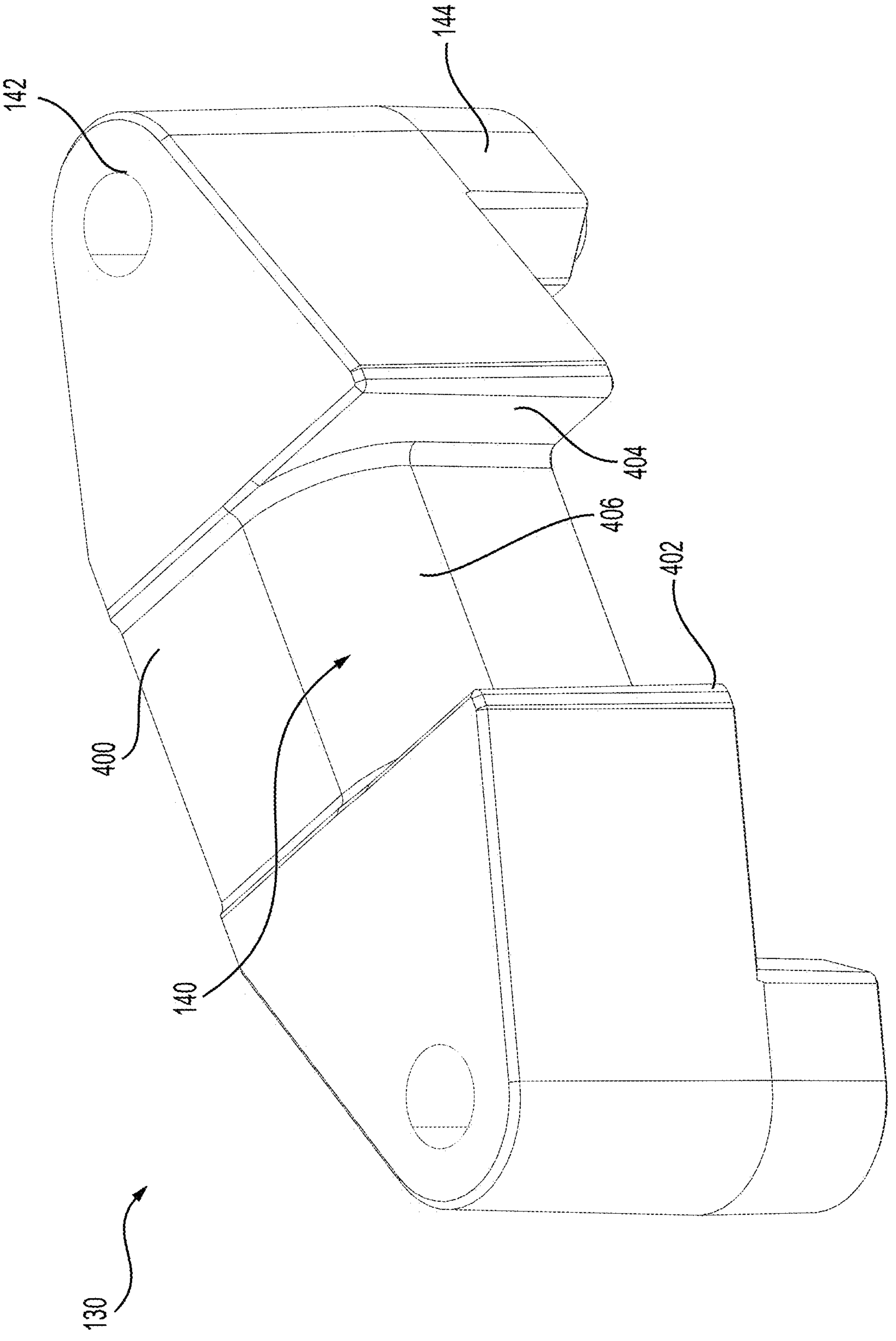
FIG. 4 is a top perspective view of a second bracket member.

Referring to FIG. 4, there is a top perspective view of a second bracket member 130. As shown, the second bracket member 130 includes a second channel 140, a plurality of second apertures 142, and a first and second legs 144. The second channel 134 includes a bottom side 400, a left side 402, and a right side 404, which are sized and positioned such that the width of the second channel 140 matches or otherwise conforms to the shape of the first segment 116, second segment 118, and curved segment 120 of the bus bar 104. Accordingly, the first segment 116, second segment 118, and curved segment 120 should be able to be placed within and removed from the second channel 140 with minimal movement between the pieces, and without causing damage to either the second channel 140 or the bus bar 104.

In the current embodiment, the bus bar segments, 116 and 118, are rectangular in shape and the curved segment 120 is a bent rectangular shape, leading to a rectangular channel 134. Accordingly, that the bottom side 400 is wider than the equally sized left side 402 and right side 404. Due to the positioning of the second channel 140 with respect to the curvature of the bus bar 104, the second channel is shown with the sides, 400, 402, and 404, each having curvature that matches. Accordingly, the bottom side 400 includes a curved side 406 separating the two portions of the bottom side 400. However, as shown in FIGS. 2 and 5, portions of the left and right sides, 402 and 404, are not as tall as the first segment 116, second segment 118, or curved segment 120, such that portion of the segments, 116, 118, and 120, when placed within the second channel 140, extend out past the second channel 140.

The second apertures 142 are through holes such that the fasteners 132 pass through without directly coupling to the second bracket member 130.

The legs 144 extend from the second bracket member 130 and the second apertures 130 pass therethrough. The legs 144 are sized and positioned such that space between them matches or otherwise conforms to the shape of the sensor 102 at that location. The legs 144 are configured to couple to the ears 110 of the sensor 102 thereby coupling the sensor 102 to the second bracket member 130.

Further, as with the first bracket member 128, the second bracket member 130 is designed as a single piece such that it may be 3-D printed for ease of manufacturing.

The illustrated second channel 140 is shown with the bottom side 400 extending in a horizontal direction and vertical direction, separated by the curved side 406. The portions of the bottom side 400 are situated such that the bottom sides 400 are shifted approximately 90 degrees with respect to one another. Similarly to the bus bar 400, these portions of the bottom section 400 may also be considered sections of the second channel 140 themselves. These channel sections may be shifted in any number of angles with respect to one another to conform to various bus bar 104 shapes.

However, in other embodiments, the second channel 140 may be any number of shapes and may completely contain the first segment 116, second segment 118, and/or curved segment 120 of the bus bar 104 or the second channel 140 may instead contain an even smaller portion of the segments, 116, 118, and 120. In further embodiments, the legs 144 may be any number of shapes or sizes and may have no relation to the shape of the sensor 102.

In further embodiment, the sides, 400, 402, and 404, of the second channel 140 may include a texture or insert to provide additional grip when coupled to the bus bar 104, to help protect the second bracket member 130 and the bus bar 104, and/or to provide shock absorption between the second bracket member 130 and the bus bar 104. The texture or insert may be any number of materials and may be integral with the second channel 140 or may be removably coupled with the second channel 140.

Referring to FIG. 5, there is shown a bracket assembly 106 in an assembled configuration. As shown, there is a first bracket member 128, a second bracket member 130, and a fastener 132. When in the assembled configuration, the first channel 134 in the first bracket member 128 aligns with the second channel 140 in the second bracket member 130, creating a slot 500.

Due to the sizing of the first channel 134 and second channel 136, as shown in FIGS. 3 and 4, the slot 500 is accordingly sized and shaped such that it conforms to the shape of at least a portion of the first segment 116, second segment 118, and curved segment 120 of the bus bar 104. Further, the height of the slot 500 is slightly less than the height of the first segment 116 of the bus bar 104, such that when the bracket assembly 106 is fastened together over the bus bar 104, the bus bar 104 is pressed between the top side 300 of the first channel 134 and bottom side 400 of second channel 140.

Figure 6:
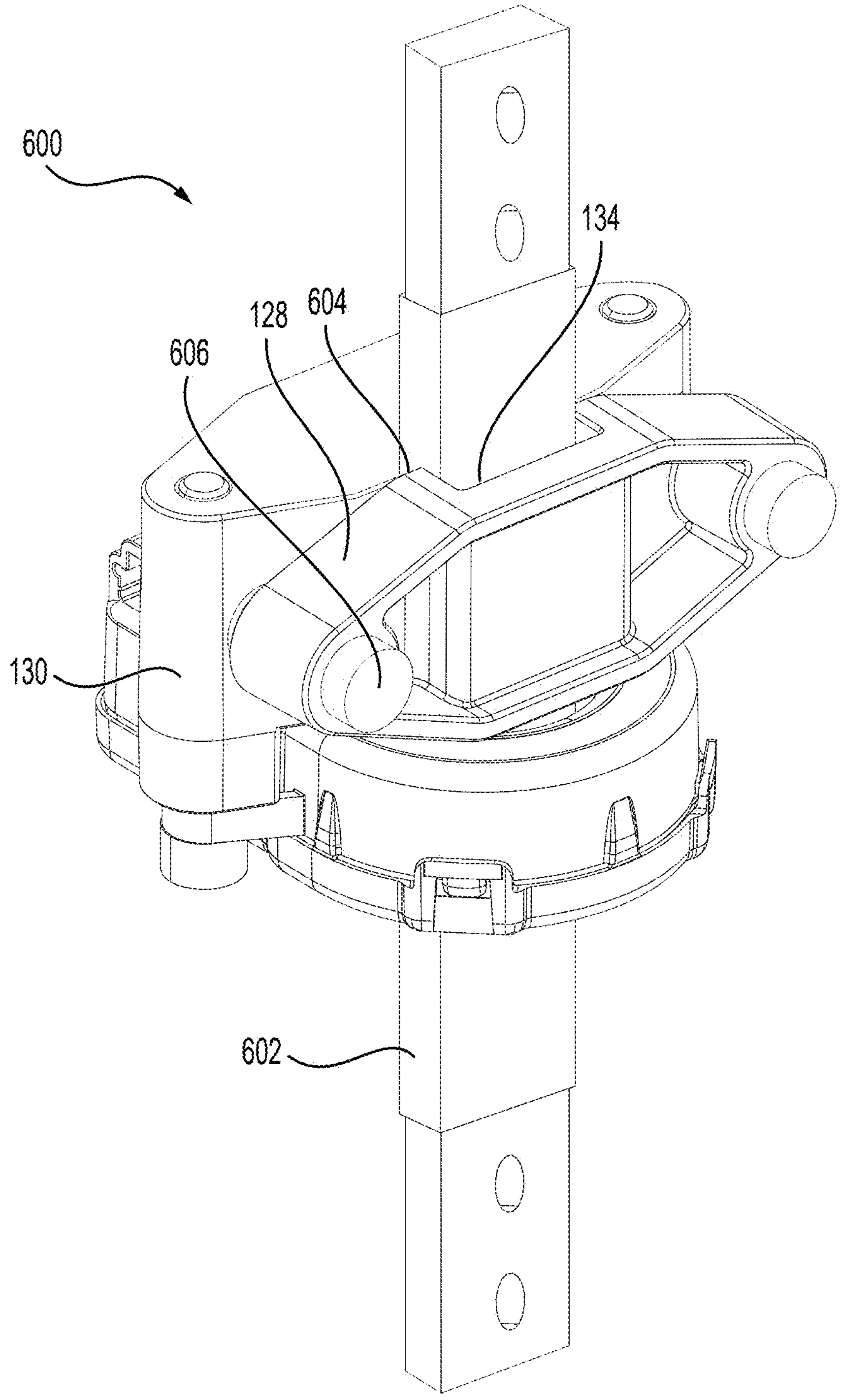
FIG. 6 is a bus bar assembly having a flat bus bar.

Referring to FIG. 6, there is shown a bus bar assembly 600 for a flat bus bar 602 in an assembled configuration. In this embodiment, a third channel 604 does not include the horizontal and curved portions that are present in the second channel 140, such that the third channel 604 is a vertical channel. Further, the first bracket member 128 has been rotated such that the first channel 134 now aligns with the third channel 604. Additional fasteners 606 are now required to affix the first and second support members, 128 and 130, together.

Rather than the slot (not shown), formed by the third channel 604 and the second channel 140, conforming to a curved segment 120 of the bus bar 104, the slot is now a straight channel. The slot is configured to conform to and clamp around a single segment of the bus bar 602.

INDUSTRIAL APPLICABILITY

The sensor support assembly 100 described above uses a two-piece bracket assembly 106 to rigidly couple a pass-through sensor 102 to a bus bar 104. Such a coupling allows the second segment 118 of the bus bar 104 to be easily situated centrally within the pass-through sensor 102, helping to increase the accuracy of the sensor's 102 measurements. Further, the rigid nature of the sensor support assembly 100 reduces the potential of the sensor 102 and bus bar 104 to move relative to one another, which reduces the potential for erroneous measurements when the sensor support assembly 100 undergoes vibration and shock during normal usage.

Additionally, the bus bar assembly 100 does not necessitate that any structure, other than the bus bar 104 to be sensed, pass through the main aperture 108 of the sensor 102. This helps reduce the potential noise or other interference which may affect the readings of the sensor 102. Accordingly, the sensor 102 may only sense only the single section of bus bar 104 passing therethrough and may provide more accurate and reliable readings.

Finally, the sensor support assembly's 100 clamping structure and sloped second channel 140 allow the rigid coupling of the assembly 100 in multiple axes without requiring any modifications to the bus bar 104, such as drilling, adhesives, or permanent mechanical fixing. This helps eliminate any necessary damage to the bus bar and allows the system to be easily and repeatedly assembled and disassembled, or for various portions to be upgraded and/or replaced, without damaging any portions of the assembly.

While aspects of the present disclosure have been particularly shown and described with reference to the embodiments above, it will be understood by those skilled in the art that various additional embodiments may be contemplated by the modification of the disclosed machines, systems, and methods without departing from the spirit and scope of the disclosure. Such embodiments should be understood to fall within the scope of the present disclosure as determined based upon the claims and any equivalents thereof.

What is claimed is:

1. A bus bar assembly, comprising:

a bus bar having a first side and a second side opposite the first side, the bus bar further having a first segment, a second segment and a curved segment, the first segment and second segment connected through the curved segment;

a bracket assembly, including:

a first bracket member having a first channel that conforms to a portion of the first segment of the bus bar, the first channel including a top side engaging the first side;

a second bracket member having a second channel including:

a first channel section that conforms to the portion of the first segment of the bus bar, the first channel section including a bottom side engaging the second side of the first segment; and a second channel section that conforms to a portion of the second segment of the bus bar, the second channel section including a bottom side engaging the second side of the second segment; and a curved channel section that conforms to a portion of the curved segment of the bus bar, the curved channel section including a bottom side engaging the second side of the curved segment;

a pass-through current sensor including an aperture having a portion of the bus bar extending therethrough;

a fastener:

securing the first bracket member to the second bracket member over the first segment of the bus bar such that the first segment sits within the first channel and the first channel section; and securing the sensor to the second bracket member.

2. The bracket assembly of claim 1, wherein the second bracket member includes a first leg and a second leg with a portion of the sensor being positioned between the legs.

3. The bracket assembly of claim 2, wherein the current sensor includes outwardly extending ears which mate with bottoms of the legs.

4. The bracket assembly of claim 1, wherein the first bracket member, second bracket member, and sensor each include an aperture, the fastener extending through the apertures.

5. The bracket assembly of claim 1, wherein the fastener does not contact the bus bar.

6. The bus bar assembly of claim 1, wherein the sensor includes a connector that is not obscured by the bracket assembly.

7. A method of mounting a current sensor to a bus bar having a first side and a second side and including a first segment, a second segment, and a curved segment, using a bracket assembly having a first bracket member including a first channel that conforms to the shape of the first segment of the bus bar, a second bracket member including a second channel that conforms to the shape of the first segment, second segment, and curved segment of the bus bar, the method comprising:

placing the first bracket member over the first side of the first segment of the bus bar such that the first segment sits within the first channel;

placing the second bracket member over the second side of the first segment, the second segment, and the curved segment of the bus bar such that the first, second, and curved segments sit within the second channel, and further such that the bus bar is pressed between the first bracket member and second bracket member;

placing the second segment of the bus bar through an aperture in the sensor;

placing the current sensor against the second bracket member; and fastening the current sensor, the second bracket member, and the first bracket member together.

8. The method of claim 7, wherein placing the second segment of the bus bar through an aperture in the sensor includes positioning the second segment away from a wall of the sensor defining the aperture.

9. The method of claim 8, wherein placing the current sensor against the second bracket member includes positioning a portion of the current sensor between legs on the second bracket member.

10. The bracket assembly of claim 1, wherein the first channel section is oriented 90 degrees with respect to the second channel section.

11. The bracket assembly of claim 1, wherein the depth of the first channel of the first bracket member is less than the thickness of the first segment.

12. The bracket assembly of claim 1, wherein the aperture, the bracket assembly being positioned outside the aperture.

* * * * *